(12) United States Patent
Yun et al.

(10) Patent No.: US 10,038,422 B2
(45) Date of Patent: Jul. 31, 2018

(54) SINGLE-CHIP MULTI-FREQUENCY FILM BULK ACOUSTIC-WAVE RESONATORS

(71) Applicant: QUALCOMM Incorporated, San Diego, CA (US)

(72) Inventors: Changhan Hobie Yun, San Diego, CA (US); Je-Hsiung Lan, San Diego, CA (US); Chengjie Zuo, San Diego, CA (US); David Berdy, San Diego, CA (US); Jonghae Kim, San Diego, CA (US); Mario Velez, San Diego, CA (US); Niranjan Sunil Mudakatte, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 78 days.

(21) Appl. No.: 15/247,803

(22) Filed: Aug. 25, 2016

(65) Prior Publication Data

US 2018/0062617 A1    Mar. 1, 2018

(51) Int. Cl.
| | | |
|---|---|---|
| *H03H 9/205* | (2006.01) | |
| *H03H 3/04* | (2006.01) | |
| *H01L 41/332* | (2013.01) | |
| *H03H 9/54* | (2006.01) | |
| *H03H 3/02* | (2006.01) | |

(52) U.S. Cl.
CPC .......... *H03H 9/205* (2013.01); *H01L 41/332* (2013.01); *H03H 3/04* (2013.01); *H03H 9/54* (2013.01); *H03H 2003/021* (2013.01); *H03H 2003/0435* (2013.01); *H03H 2003/0471* (2013.01)

(58) Field of Classification Search
CPC ...... H03H 9/02015; H03H 9/205; H03H 9/58; H03H 9/582; H03H 9/587; H03H 3/02; H03H 3/04; H03H 2003/021; H03H 2003/0435; H03H 9/54; H03H 2003/0471; H01L 41/332
USPC ......................... 333/187, 189, 133; 29/25.35
See application file for complete search history.

(56) References Cited

U.S. PATENT DOCUMENTS

| | | | |
|---|---|---|---|
| 6,437,667 B1 * | 8/2002 | Barber | ..................... H03H 3/04 310/312 |
| 6,441,703 B1 * | 8/2002 | Panasik | .................. H03H 9/589 29/25.35 |
| 6,518,860 B2 | 2/2003 | Ella et al. | |
| 6,842,089 B2 | 1/2005 | Lee | |
| 6,874,211 B2 | 4/2005 | Bradley et al. | |
| 7,408,287 B2 | 8/2008 | Matsumoto et al. | |
| 7,439,824 B2 * | 10/2008 | Aigner | ............... H03H 9/02118 333/187 |

(Continued)

OTHER PUBLICATIONS

International Search Report and Written Opinion—PCT/US2017/045982—ISA/EPO—Nov. 30, 2017.

*Primary Examiner* — Barbara Summons
(74) *Attorney, Agent, or Firm* — Haynes and Boone, LLP (57) ABSTRACT

A single-die multi-FBAR (film bulk acoustic resonator) device includes multiple FBARs having different resonant frequencies formed over a single substrate. The FBARs include piezoelectric layers having different thicknesses but with upper electrodes formed at a same height over the substrate, lower electrodes at different heights over the substrate, and different sized air gaps separating the lower electrodes from the substrate.

20 Claims, 7 Drawing Sheets

(56) References Cited

U.S. PATENT DOCUMENTS

| | | | |
|---|---|---|---|
| 7,583,163 B2* | 9/2009 | Osone | H03H 3/04 333/187 |
| 2005/0099092 A1* | 5/2005 | Nakamura | H03H 3/02 310/320 |
| 2006/0006965 A1 | 1/2006 | Ishii | |
| 2006/0214539 A1 | 9/2006 | Sato | |
| 2010/0134210 A1* | 6/2010 | Umeda | H03H 3/04 333/189 |
| 2015/0333727 A1* | 11/2015 | Moulard | H03H 3/04 310/365 |

* cited by examiner

SINGLE-CHIP MULTI-FREQUENCY FILM BULK ACOUSTIC-WAVE RESONATORS

TECHNICAL FIELD

The present invention relates to a film bulk acoustic resonator (FBAR) device, and more particularly to an FBAR device that includes multiple FBARs having different resonant frequencies on the same die or substrate, and a method for fabricating such a device.

BACKGROUND

Cell phones and other radio frequency (RF) devices often utilize a film bulk acoustic wave resonator (FBAR) for filtering RF signals. The FBAR resides on a substrate such as a semiconductor or glass substrate and includes a thin film of a piezoelectric material such as zinc oxide (ZnO) or aluminum nitride (AlN) that is sandwiched between metal electrodes. The RF signal drives the electrodes and will excite a resonant excitation in the piezoelectric layer at the fundamental resonant frequency for the FBAR that depends upon the thickness of the piezoelectric layer.

Figure 1:
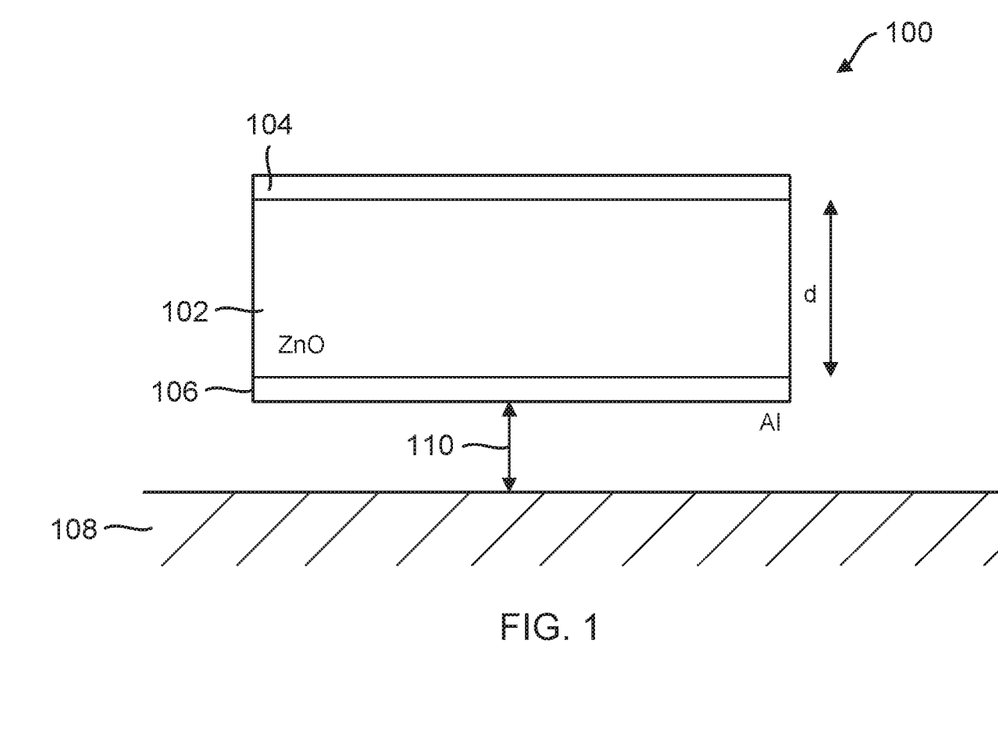
FIG. 1 is a cross-sectional view of a conventional film bulk acoustic resonator (FBAR).

A conventional FBAR 100 is shown in FIG. 1. A piezoelectric layer 102 is sandwiched between upper and lower metal layers/electrodes 104 and 106. The resonant frequency for FBAR 100 is determined by a total thickness d across lower electrode 106, the piezoelectric layer 102, and the upper electrode 104. An RF signal applied across electrodes 104 and 106 produces an electric field within piezoelectric layer 102 that induces a bulk acoustic wave. In order to maintain high quality performance, the bulk acoustic wave should be isolated from a substrate 108. In one configuration, FBAR 100 is unsupported, i.e., there is an "air gap" 110 between FBAR 100 and substrate 108. The acoustical isolation from air gap 110 prevents acoustic energy leakage from the device into substrate 108.

Since the resonant frequency depends upon the thickness d, an RF filter operating in several frequency bands requires multiple FBARs each having an appropriate thickness to provide the desired resonant frequencies. But the deposition of the piezoelectric layer for an FBAR is performed under vacuum using physical vapor deposition. If the vacuum is broken so that additional mask steps can be performed followed by additional piezoelectric layer depositions to produce different piezoelectric layer thicknesses, the piezoelectric layer quality is compromised. A conventional multi-band RF filter implemented using FBARs thus requires separate FBARs each having their own substrates so that the deposition of the piezoelectric layer thickness can be individually tuned. But the usage of multiple FBAR devices increases costs and manufacturing complexity. In another attempt to produce multiple FBARs on a single substrate for a multi-band RF filter, a deposited single-thickness piezoelectric layer may be etched using multiple etching and masking steps to provide various piezoelectric layers of different thicknesses on the same device. But the etching of the piezoelectric layer is problematic in that the electrode-facing surfaces become too rough, which reduces the quality for the resulting FBAR devices.

Accordingly, there is a need in the art for an improved multi-FBAR device.

SUMMARY

A multi-FBAR device is provided in which the piezoelectric layer may be deposited in a single deposition step. In this fashion, the quality of the piezoelectric material is maintained since the piezoelectric layer is deposited under a continuous vacuum. Despite this single deposition of a piezoelectric layer, the resulting FBAR devices have a range of piezoelectric layer thicknesses. To achieve these various thicknesses, multiple sacrificial layers are deposited onto a substrate to form a sacrificial layer structure for each future FBAR. Depending upon how many sacrificial layers are included in a given sacrificial layer structure, the sacrificial layer structure will have a varying height or thickness above the substrate surface. For example, one sacrificial layer structure can have just one sacrificial layer such that it will be relatively thin. Another sacrificial layer structure may be formed from two sacrificial layers such that it is thicker. In this fashion, the more sacrificial layers are included in a given sacrificial layer structure, the thicker it will be. A metal layer is then deposited over the various sacrificial layer structures and patterned to form a bottom electrode for each future FBAR.

The piezoelectric layer is then deposited in a single deposition step over the bottom electrodes and the corresponding sacrificial layer structures. Due to various heights for the sacrificial layer structures, the deposited piezoelectric layer will have a stepped profile despite it being deposited in a single deposition step. The deposited piezoelectric layer will thus have a higher profile over the taller sacrificial layer structures and will have a lower profile over the shorter sacrificial layer structures. This stepped profile for the deposited piezoelectric layer is then eliminated such as through a chemical-mechanical polishing step to produce a planar upper surface for the polished piezoelectric layer. The polished piezoelectric layer will thus be relatively thin over the taller sacrificial layer structures and relatively thick over the shorter sacrificial layer structures. An upper metal layer is then deposited and patterned over the polished piezoelectric layer to form the upper electrode layers for the FBAR devices and the sacrificial layers etched away. The resulting FBAR devices on a single substrate are quite advantageous in that different resonant frequencies are achieved in a single substrate device yet the piezoelectric layer quality is high as only a single deposition step was required. Furthermore, the various piezoelectric layer thicknesses are achieved without requiring etching of the piezoelectric layer electrode-facing surfaces, which further enhances the piezoelectric layer quality.

These and additional advantageous features for the disclosed multi-FBAR devices may be better appreciated through consideration of the following detailed description.

DETAILED DESCRIPTION

Figure 2:
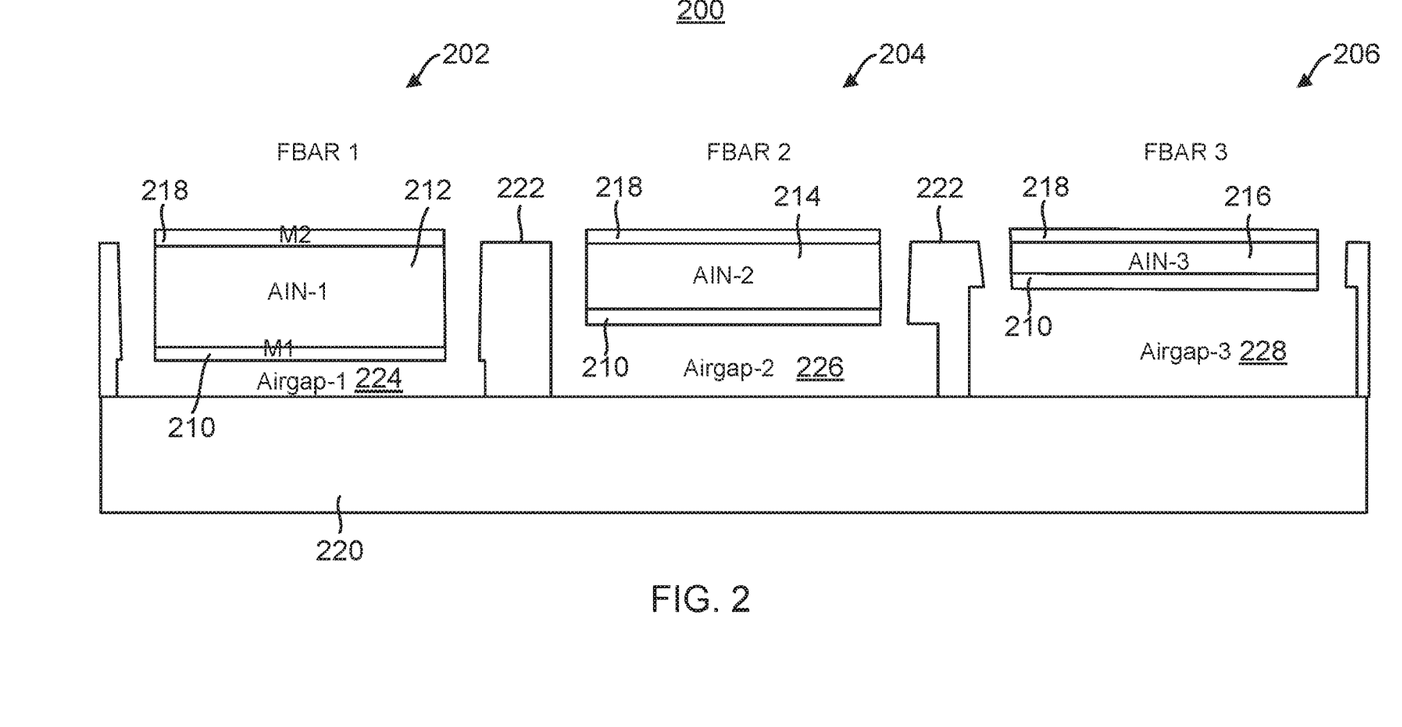
FIG. 2 is a cross-sectional view of a single-die multi-FBAR device according to an aspect of the disclosure.

FIG. 2 is a cross-sectional view of a single-die multi-frequency film bulk acoustic resonator (FBAR) device 200 according to an embodiment. Device 200 includes an FBAR 202, an FBAR 204, and an FBAR 206, each having a different resonant frequency. Each FBAR includes a lower electrode 210 and an upper electrode 218 that sandwich a corresponding one of piezoelectric layers 212, 214, 216. In FBAR 202, piezoelectric layer 212 is relatively thick such that a resonant frequency for FBAR 202 is relatively low. In contrast, piezoelectric layer 214 in FBAR 204 is thinner than piezoelectric layer 212 such that the resonant frequency for FBAR 204 is greater than the resonant frequency for FBAR 202. Similarly, piezoelectric layer 216 in FBAR 206 is thinner than piezoelectric layer 214 such that the resonant frequency for FBAR 206 is greater than the resonant frequency for FBAR 204 (and hence is greater by an even larger margin over the resonant frequency for FBAR 202). The thickness for each piezoelectric layer depends upon the desired resonant frequency. In one embodiment, the thickness for piezoelectric layer 212 is at least twice as great as the thickness for piezoelectric layer 216.

Each bottom electrode 210 is separated from a substrate 220 by a corresponding air gap. In FBAR 202, a relatively thin air gap 224 separates its bottom electrode 210 from substrate 220. In contrast, bottom electrode 210 for FBAR 204 is separated from substrate 220 by a larger air gap 226. Similarly, an even larger air gap 228 separates bottom electrode 210 for FBAR 206 from substrate 220. Note that as the air gap for a given FBAR becomes larger, the corresponding piezoelectric layer thickness becomes thinner. The sum of the air gap separation and piezoelectric layer thickness for each FBAR is a constant such that top electrodes 218 are all aligned in the same plane with respect to substrate 220. The FBARs are separated from each other by perimeter structures 222, which may provide additional mechanical rigidity.

Although three FBARs are shown in FIG. 2 for device 200, it will be appreciated the number of FBARs in a given device may be greater than or less than three using the methods described herein. Furthermore, various numbers of FBARs may be used in the construction of a single RF filter. As will be explained further herein, piezoelectric layers 212, 214, and 216 are formed in a single deposition step such that a vacuum used during their deposition need not be broken. No additional piezoelectric layers need to be deposited besides the single deposition of piezoelectric layers 212, 214, and 216. The resulting quality of piezoelectric layers 212, 214, and 216 is thus advantageously high despite their various thicknesses. Moreover, no etching of the piezoelectric layer surfaces facing electrodes 210 and 218 is necessary to produce these various thicknesses so that etching-induced quality reductions for piezoelectric layers 212, 214, and 216 are avoided.

The air gap separation corresponds to the height of the corresponding sacrificial layer structure. After deposition of the sacrificial layer structures on substrate 220 and formation of bottom electrodes 210 on each sacrificial layer structure, a single deposition step is used to deposit a piezoelectric layer on the sacrificial layer structures. Although the thickness of the deposited piezoelectric layer is substantially constant, the deposited piezoelectric layer will have a stepped profile that corresponds to the height of the various sacrificial layer structures over which it was deposited. This stepped profile is then ground down such that an upper surface of the ground piezoelectric layer is planar. The equality for the sum of the air gap separation and piezoelectric layer thickness for each FBAR 202, 204, and 206 results from planarity of the ground piezoelectric layer after the sacrificial layer structures are etched away.

Figure 3A:
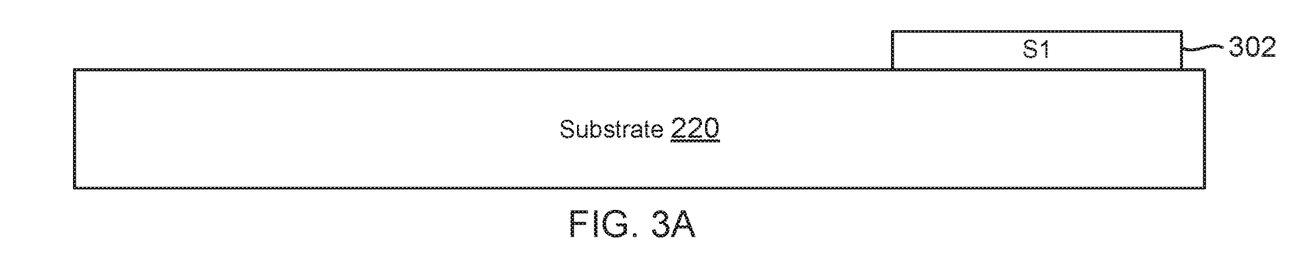
FIGS. 3A-3D are cross-sectional views of steps of depositing sacrificial layers and a bottom metal layer to form the multi-FBAR device of FIG. 2.

The fabrication process of FBARs having various resonant frequencies on a single substrate (single die) will now be discussed in more detail. As shown in FIG. 3A, a first sacrificial layer (S1) 302 corresponding to a first sacrificial layer structure is deposited, e.g., by physical vapor deposition (PVD), on substrate 220. Substrate 220 may be a dielectric material such as glass or may comprise a semiconductor such as a high resistance silicon (Si). The sacrificial layer material should be one that is easily formed and removed, as well as resistant to the high temperature procedures used for deposition of the piezoelectric material. Exemplary sacrificial layer materials include molybdenum or amorphous silicon.

Figure 3B:
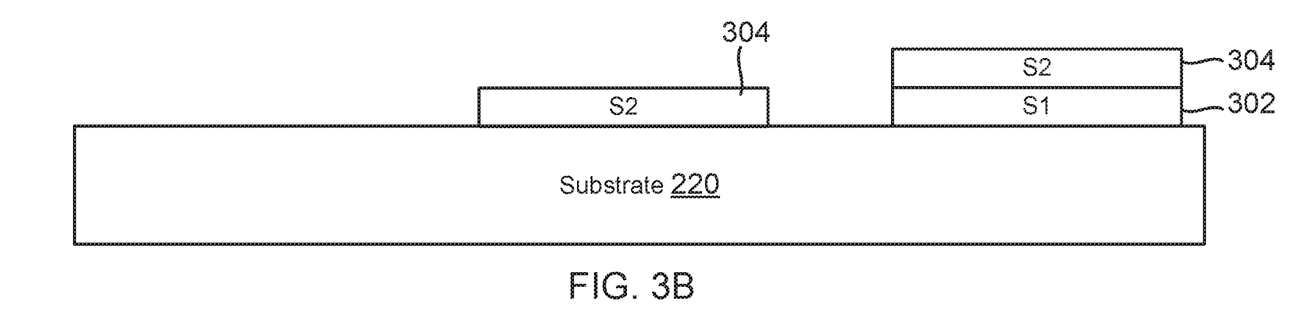
Figure 3C:
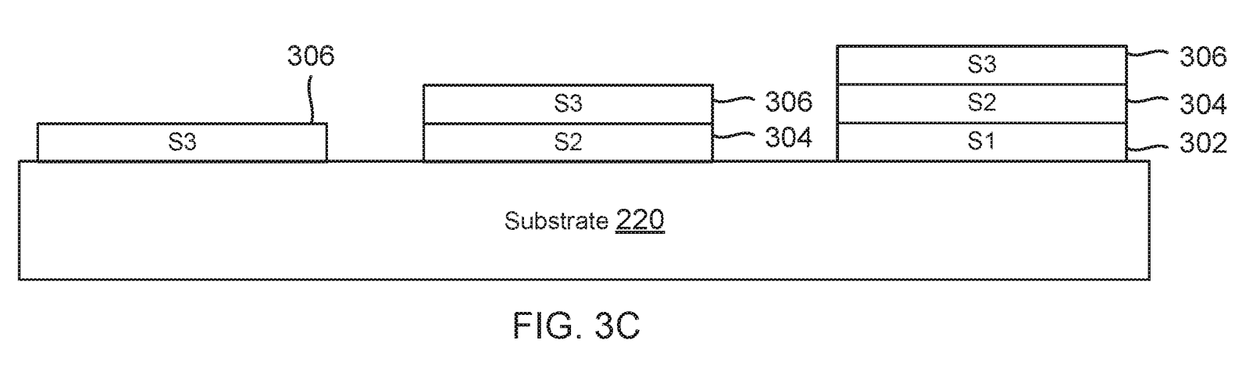

As shown in FIG. 3B, a second sacrificial layer (S2) 304 is deposited on the first sacrificial layer 302 for the sacrificial layer structure of FIG. 3A and to begin a second sacrificial layer structure. These sacrificial layer structures are completed as shown in FIG. 3C with the deposition of a third sacrificial layer (S3) 306 over the two sacrificial layer structures of FIG. 3B. In addition, a third sacrificial layer structure is formed using just third sacrificial layer 306. One sacrificial layer structure thus consists of just third sacrificial layer 306 and is relatively short. Referring back to FIG. 2, it may be seen that this first sacrificial layer structure forms air gap 224 for FBAR 202 after it etched away. A second sacrificial layer structure is taller as it also includes second sacrificial layer 304. This second sacrificial layer structure will form air gap 226 for FBAR 204 after it is etched away. Finally, a third sacrificial layer structure will form air gap 228 for FBAR 206 after it is etched away. This third sacrificial layer structure is relatively tall since it includes all three sacrificial layers.

The sacrificial layers may be of different thicknesses, e.g., S3>S2>S1, as long as the combination of layers corresponds to the desired height of the corresponding air gap 224, 226, 228 for each different FBAR 202, 204, 206. For example, in an embodiment, the thicknesses of the sacrificial layers may range from 0.5 µm to 2 µm.

Figure 3D:
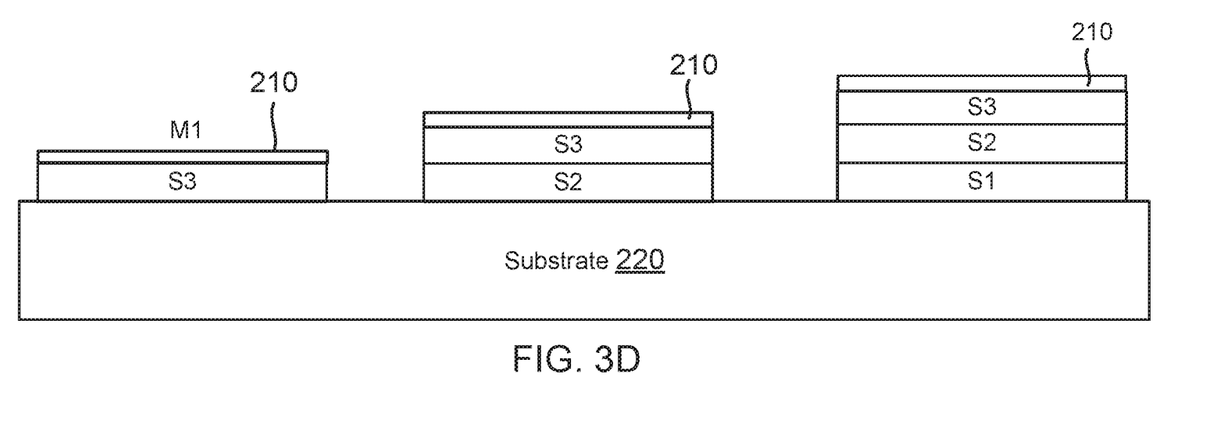

After all sacrificial layers have been deposited, a first metal layer M1 is deposited and patterned to form as bottom electrode 210 on each sacrificial layer structure as shown in FIG. 3D. The metal for the electrodes 210 may be, e.g., aluminum or molybdenum or a combination of aluminum under molybdenum to protect electrodes 210 from the sacrificial layer etching.

Figure 4A:
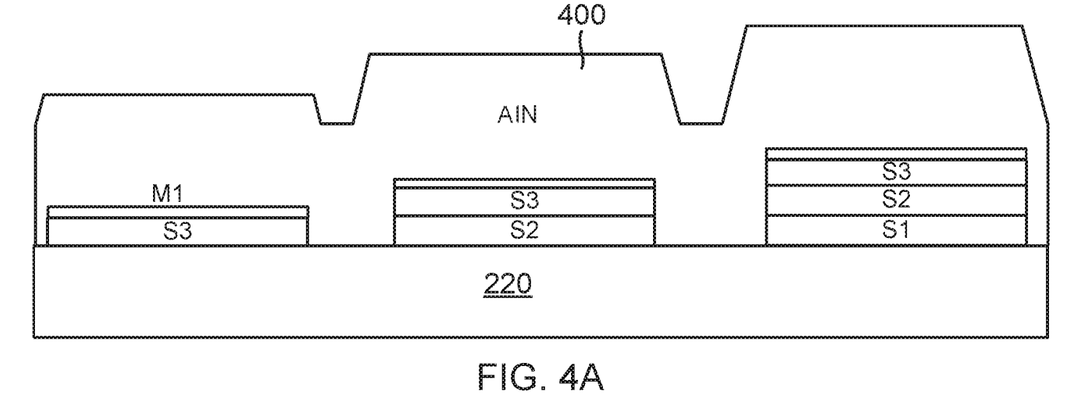
FIG. 4A is a cross-sectional view after deposition of a piezoelectric layer over the bottom electrodes and corresponding sacrificial layer structures of FIG. 3D.
Figure 4B:
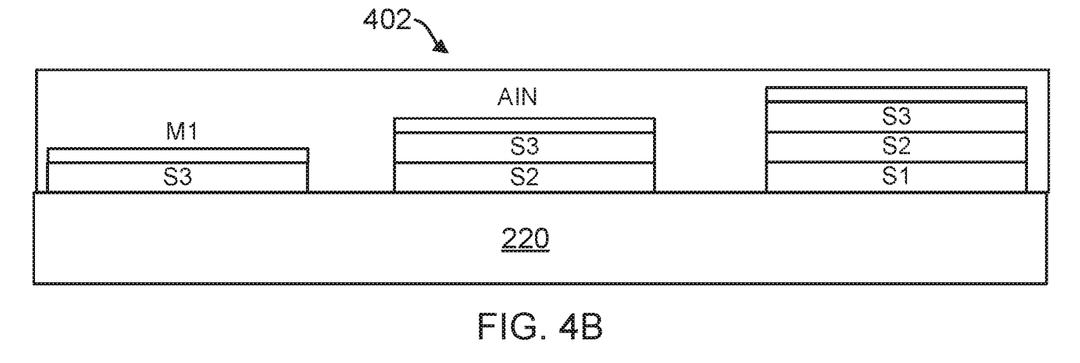
FIG. 4B is a cross-sectional view after grinding the deposited piezoelectric layer of FIG. 4A.

The electrode-capped sacrificial layer structures are then covered by the deposition of piezoelectric layer 400, e.g., by PVD as shown in FIG. 4A. In general, the use of PVD requires a vacuum which need not be broken since only a single deposition step is necessary. This is quite advantageous with regard to maintaining a high quality of manufacture for piezoelectric layer 400. The deposited piezoelectric layer may comprise AlN, ZnO, or another suitable material. As shown, the upper surface of the deposited piezoelectric layer 400 has a non-uniform height due to the non-uniform heights of the different sacrificial layer structures for the various FBARs. This stepped upper surface is then planarized to form a planar piezoelectric layer surface 402 as shown in FIG. 4B. For example, chemical mechanical polishing may be used to form planar piezoelectric layer surface 402.

Figure 5A:
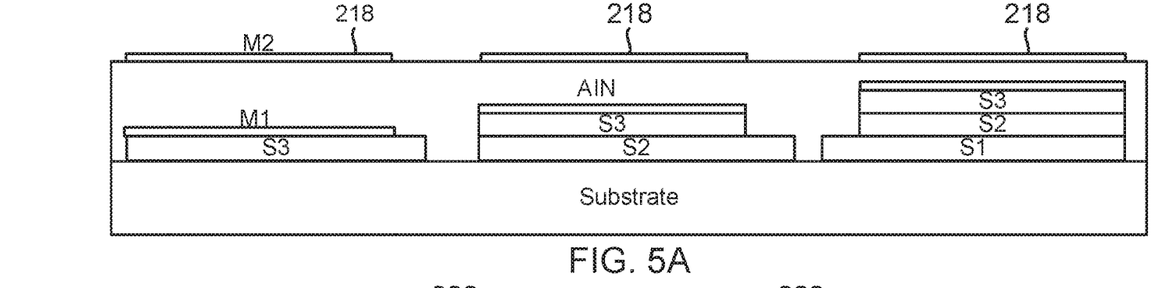
FIG. 5A is a cross-sectional view after patterning of an upper metal layer on the ground piezoelectric layer of FIG. 4B.

A second metal layer M2 is deposited and patterned on planar piezoelectric layer surface 402 to form upper electrodes 218 for the various FBARs as shown in FIG. 5A. The metal used may be the same as those used for the M1 layer, but Al may be preferred for its low electrical resistance. Alternatively, copper may also be used.

Figure 5B:
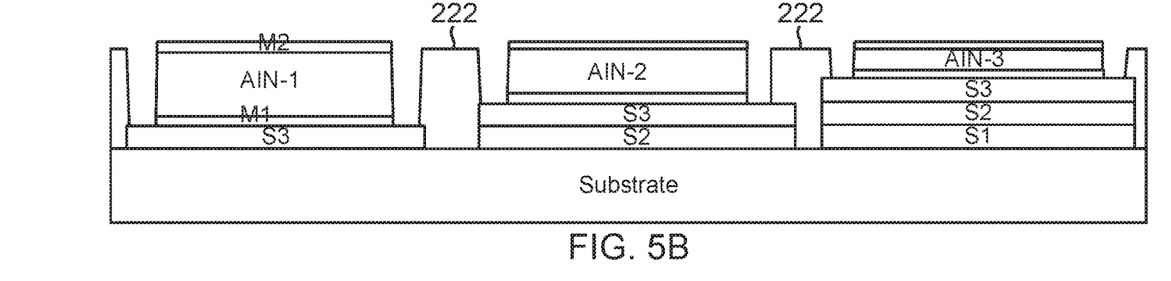
FIG. 5B is a cross-sectional view after the formation of perimeter structures between the multiple FBARs of FIG. 5A.

The piezoelectric layer may then be patterned to form the sidewalls for the various FBARs as shown in FIG. 5B. Note that this sidewall etching does not affect the electrode-facing surfaces for the piezoelectric layer since the electrodes are already formed. This etching step thus causes no reduction in quality for the FBARs. In contrast, should an etching process be used to produce the various piezoelectric layer thicknesses as performed in a conventional process, the quality for the resulting piezoelectric layers would suffer due to the roughening of the electrode-facing surfaces. The FBARs disclosed herein do not suffer from such etching-induced reductions in quality. The patterning of the piezoelectric layer may also produce separation structures 222 between neighboring ones of the FBARs, which assist in increasing mechanical strength for the resulting device.

Figure 5C:
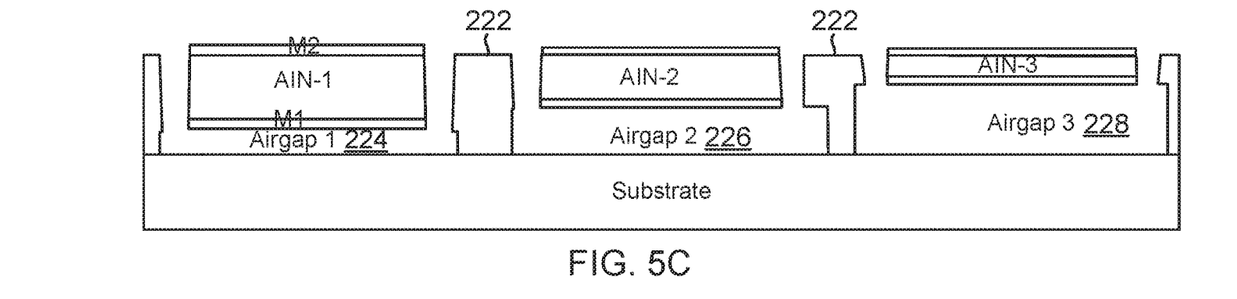
FIG. 5C is a cross-sectional view after an etching of the sacrificial layers to form air-gaps below the multiple FBARs of FIG. 5B.

Finally, the sacrificial layer structures are etched away as shown in FIG. 5C. The etch may be a $XeF_2$ gas etch for molybdenum or amorphous silicon sacrificial layer materials. The manufacture process 600 is summarized with regard to the flowchart of FIG. 6. The method includes an act 602 of depositing a first sacrificial layer such as layer S1 of FIG. 3A. Similarly, the method includes an act 604 of depositing a second sacrificial layer 604 such as layer S2 of FIG. 3B. In general, one needs at least two sacrificial layers for the production of two FBARs having different resonant frequencies. Each additional sacrificial layer enables the generation of another FBAR tuned to another resonant frequency. The deposition of up to an Nth (N being an arbitrary plural integer greater than 2) sacrificial layer as represented by act 606 thus enables the generation of an RF filter responsive to N different resonant frequencies.

Figure 6:
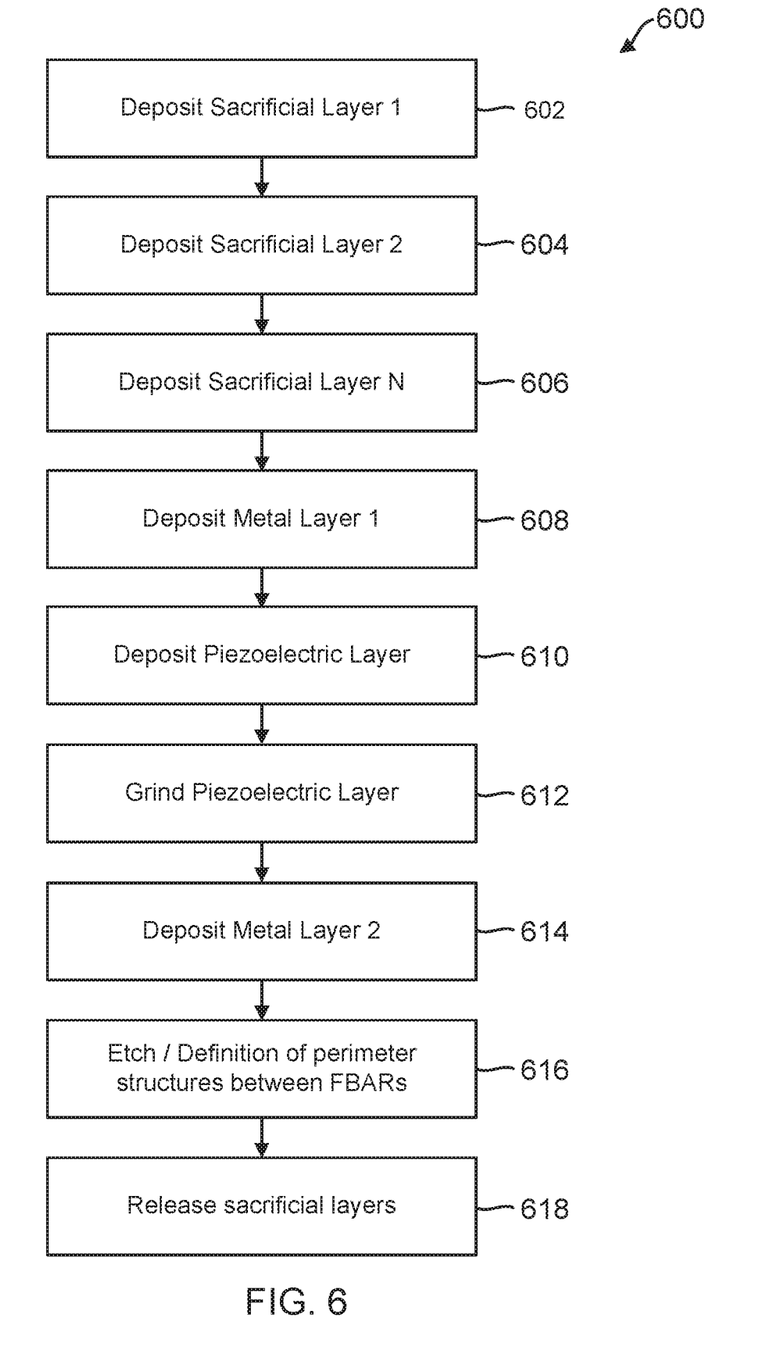
FIG. 6 is a flow diagram illustrating a process for forming a single-die multi-FBAR device according to an aspect of the disclosure.

After the suitable number of N sacrificial layers are deposited, the M1 metal layer is deposited over the sacrificial layer structures and patterned in an act 608 to form the bottom electrodes. The piezoelectric layer may then be deposited over the electrode-capped sacrificial layer structures in an act 610 and planarized in a grinding act 612. The M2 metal layer may then be deposited and patterned to form the top electrodes for the resulting FBARs in an act 614. The formation of the top electrodes forms electrode pairs, each electrode pair including one top electrode facing a corresponding bottom electrode and separated by a piezoelectric layer portion. With the top electrodes deposited, the sidewalls of the FBARs are etched along with the formation of the perimeter structures from the piezoelectric layer in an act 616. Finally, the sacrificial layers are released through etching in an act 618 to complete the multi-FBAR device.

Although a specific embodiment of the invention is described and illustrated above, the invention is not to be limited to the specific forms or arrangements of parts so described and illustrated. Various modifications to the implementations described in this disclosure may be readily apparent to those skilled in the art, and the generic principles defined herein may be applied to other implementations without departing from the scope of this disclosure. Thus, the claims are not intended to be limited to the implementations shown herein, but are to be accorded the widest scope consistent with this disclosure. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of an FBAR device as implemented.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one or more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Additionally, other implementations are within the scope of the following claims. In some cases, the actions recited in the claims can be performed in a different order and still achieve desirable results. Also, various alternate materials, processing techniques may be used to produce similar results.

What is claimed is:

1. A single-die multi-thickness piezoelectric resonator device, comprising:
   a substrate;
   a first piezoelectric resonator including a first upper electrode, a first lower electrode, and a first piezoelectric layer positioned between the first upper electrode and the first lower electrode, wherein the first piezoelectric layer has a first thickness; and
   a second piezoelectric resonator including a second upper electrode, a second lower electrode, and a second piezoelectric layer positioned between the second upper electrode and the second lower electrode, wherein the second piezoelectric layer has a second thickness that is less than the first thickness, wherein the first upper electrode and the second upper electrode are each separated from the substrate by an equal height.

2. The device of claim 1, wherein the first lower electrode is separated from the substrate by a first air gap, and wherein the second lower electrode is separated from the substrate by a second air gap, and wherein the second air gap is greater than the first air gap.

3. The device of claim 1, further comprising a perimeter region separating the first piezoelectric resonator and the second piezoelectric resonator.

4. The device of claim 1, further comprising a third piezoelectric resonator including a third upper electrode, a third lower electrode, and a third piezoelectric layer positioned between the third upper electrode and the third lower electrode, wherein the third piezoelectric layer has a third thickness that is less than the second thickness, and
   wherein the third upper electrode is separated from the substrate by the equal height for the first upper electrode and second upper electrode.

5. The device of claim 1, wherein the first piezoelectric layer and the second piezoelectric layer each comprises aluminum nitride (AlN).

6. The device of claim 1, wherein the first upper electrode, the second upper electrode, the first lower electrode, and the second lower electrode each comprises aluminum.

7. The device of claim 1, wherein a first resonant frequency for the first piezoelectric resonator is different from a second resonant frequency for the second piezoelectric resonator.

8. The device of claim 1, wherein the substrate comprises glass.

9. The device of claim 1, wherein the substrate comprises high resistance silicon.

10. The device of claim 1, wherein the first thickness is at least twice as great as the second thickness.

11. A method of manufacturing a single-die multi-thickness piezoelectric resonator device, comprising:
sequentially depositing three sacrificial layer onto a substrate to form at least a first sacrificial layer structure, a second sacrificial layer structure, and a third sacrificial layer structure, wherein the first sacrificial layer structure has only one of the sacrificial layers, the second sacrificial layer structure is a stack of just two of the sacrificial layers, and the third sacrificial layer structure is a stack of all three of the sacrificial layers;
depositing and patterning a first metal layer to form a bottom electrode on each of the sacrificial layer structures;
depositing a single piezoelectric layer over the sacrificial layer structures and the bottom electrodes;
planarizing an upper surface of the single piezoelectric layer to form a planar surface;
depositing and patterning a second metal layer on the planar surface to form a top electrode above each bottom electrode, the top electrodes and the bottom electrodes forming three electrode pairs;
etching the planarized piezoelectric layer to form three piezoelectric layer portions corresponding to the three electrode pairs, each piezoelectric layer portion being sandwiched between the corresponding pair of electrodes; and
removing each sacrificial layer structure to form an air gap between the substrate and each bottom electrode to form a first piezoelectric resonator corresponding to the first sacrificial layer structure, a second piezoelectric resonator corresponding to the second sacrificial layer structure, and a third piezoelectric resonator corresponding to the third sacrificial layer structure.

12. The method of claim 11, wherein depositing the single piezoelectric layer comprises depositing the single piezoelectric layer using a physical vapor deposition process.

13. The method of claim 11, wherein planarizing the upper surface of the single piezoelectric layer comprises a chemical mechanical polishing of the upper surface.

14. The method of claim 11, wherein each sacrificial layer comprises molybdenum, and wherein removing each sacrificial layer structure comprises etching away the sacrificial layer structures with $XeF_2$.

15. The method of claim 11, wherein depositing the first metal layer and the second metal layer comprises depositing aluminum.

16. The method of claim 11, wherein depositing the single piezoelectric layer comprises depositing AlN.

17. A multi-thickness piezoelectric resonator device, comprising:
a substrate;
a first piezoelectric resonator separated from the substrate by a first air gap; and
a second piezoelectric resonator separated from the substrate by a second air gap, wherein the second air gap is greater than the first air gap, and wherein a first height for the first piezoelectric resonator equals a second height for the second piezoelectric resonator, wherein the first piezoelectric resonator includes a first piezoelectric layer having a first thickness, wherein the second piezoelectric resonator includes a second piezoelectric layer having a second thickness, and wherein a first sum of the first air gap and the first thickness equals a second sum of the second air gap and the second thickness.

18. The device of claim 17, wherein the substrate is selected from the group consisting of glass and semiconductor.

19. The device of claim 17, wherein the first piezoelectric layer and the second piezoelectric layer each comprises AlN.

20. The device of claim 17, wherein the first piezoelectric layer and the second piezoelectric layer each comprises ZnO.

* * * * *